US 8,658,300 B2

(12) United States Patent
Itagaki et al.

(10) Patent No.: US 8,658,300 B2
(45) Date of Patent: Feb. 25, 2014

(54) FUEL GAUGE CIRCUIT AND BATTERY PACK

(75) Inventors: Takatoshi Itagaki, Tokyo (JP); Akira Ikeuchi, Tokyo (JP); Makio Abe, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 238 days.

(21) Appl. No.: 13/143,949

(22) PCT Filed: Jan. 12, 2010

(86) PCT No.: PCT/JP2010/050223
§ 371 (c)(1),
(2), (4) Date: Jul. 11, 2011

(87) PCT Pub. No.: WO2010/082564
PCT Pub. Date: Jul. 22, 2010

(65) Prior Publication Data
US 2011/0274952 A1  Nov. 10, 2011

(30) Foreign Application Priority Data

Jan. 14, 2009  (JP) ................................ 2009-006161

(51) Int. Cl.
*H01M 10/48* (2006.01)
(52) U.S. Cl.
USPC ............................................ 429/90; 429/93
(58) Field of Classification Search
USPC .............................................. 429/90, 92, 93
See application file for complete search history.

(56) References Cited

U.S. PATENT DOCUMENTS

| | | | | |
|---|---|---|---|---|
| 5,677,077 | A | * | 10/1997 | Faulk ............................... 429/90 |
| 6,074,775 | A | * | 6/2000 | Gartstein et al. ............ 429/90 X |
| 7,875,378 | B2 | * | 1/2011 | Yang et al. ................... 429/92 X |
| 8,329,324 | B2 | * | 12/2012 | Lee et al. ..................... 429/90 X |
| 2007/0188133 | A1 | | 8/2007 | Nakano et al. |
| 2008/0094032 | A1 | | 4/2008 | Miyamoto et al. |

FOREIGN PATENT DOCUMENTS

| | | |
|---|---|---|
| JP | 2004-355837 | 12/2004 |
| JP | 2006-208152 | 8/2006 |
| JP | 2007-240523 | 9/2007 |
| JP | 2008-103219 | 5/2008 |
| JP | 2008-177424 | 7/2008 |

OTHER PUBLICATIONS

International Search Report mailed on Apr. 27, 2010.

* cited by examiner

*Primary Examiner* — Stephen J. Kalafut
(74) *Attorney, Agent, or Firm* — IPUSA, PLLC

(57) ABSTRACT

A fuel gauge circuit detects a residual quantity of a battery 1 and is disposed on a substrate 20 together with a protection circuit 40 which protects charging/discharging of the battery 1. The fuel gauge circuit includes a voltage monitor terminal T1 disposed on a side facing a positive power-supply terminal 21 of the substrate and connected to each of the positive power-supply terminal 21 and a voltage sensor 31 disposed in the circuit, a voltage through terminal T6 disposed on a side facing the protection circuit, opposite to the side facing the positive power-supply terminal 21, and connected to a voltage monitor terminal T11 of the protection circuit, and a wiring 32 disposed within the circuit to connect the voltage monitor terminal T1 of the fuel gauge circuit to the voltage through terminal T11.

4 Claims, 5 Drawing Sheets

FUEL GAUGE CIRCUIT AND BATTERY PACK

TECHNICAL FIELD

The present disclosure generally relates to a fuel gauge circuit and a battery pack, and more particularly to a fuel gauge circuit which detects a residual quantity of a battery, and a battery pack in which a fuel gauge circuit is installed.

BACKGROUND ART

In recent years, a battery pack using a lithium ion battery is installed in a mobile device, such as a digital camera. Generally, it is known that detecting directly a residual quantity of a lithium ion battery at a specific voltage is difficult. For this reason, a method of detecting a battery residual quantity is used. In this method, a microcomputer or the like is used to detect a charging/discharge current of a lithium ion battery and to compute a sum of the detected charging/discharge currents. The battery residual quantity is detected by the result of the computation.

A certain amount of current is consumed in the lithium ion battery even when the lithium ion battery is detached from the mobile device. A fuel gauge IC (a semiconductor integrated circuit) to detect the battery residual quantity of the lithium ion battery and compute the sum of the charging/discharging currents is installed on a printed circuit board together with a protection IC having a regulator function. The printed circuit board and the lithium ion battery are accommodated in a housing, and the fuel gauge IC is offered as a battery pack including the housing.

FIG. 4 is a perspective view showing the appearance of a battery pack. FIG. 5 is a top view of a circuit part of a battery pack according to the related art. As shown in FIG. 4, a printed circuit board 2 is fixed to a top surface of a lithium ion battery 1 having a rectangular shape. As shown in FIG. 5, a fuel gauge IC 3 to detect a battery residual quantity, and a protection IC 4 having a regulator function are fixed to a central portion of the top surface of the printed circuit board 2. A positive power-supply terminal 5, a negative power-supply terminal 6, and a communication terminal 7 are disposed at end portions of the top surface of the printed circuit board 2.

The power-supply terminals 5 and 6 are connected to the positive and negative electrodes of the lithium ion battery 1 via the through holes of the printed circuit board 2. These power-supply terminals 5 and 6 are connected to the positive and negative power-supply terminals of a mobile device (not illustrated). The communication terminal 7 is connected to the communication terminal of the mobile device, and information, including a battery residual quantity and other information, is transmitted and received between the fuel gauge IC 3 and the mobile device.

Patent Document 1 listed below discloses a circuit module in which a protection circuit to protect a lithium ion battery and a charging/discharging circuit to control the charging and discharging of the lithium ion battery are provided.

Patent Document 1: Japanese Laid-Open Patent Publication No. 2008-103219

DISCLOSURE OF THE INVENTION

Problem to be Solved by the Invention

In order to supply an operating current from the lithium ion battery 1 to the fuel gauge IC 3 and the protection IC 4, the positive and negative power-supply terminals 5 and 6 of the printed circuit board 2 are connected to the positive and negative power-supply terminals of the fuel gauge IC 3 and the protection IC 4 via the through holes, respectively. It is necessary to provide a wiring for monitoring a power supply voltage of the lithium ion battery 1 (the voltage of the terminal 5) in the fuel gauge IC 3 and the protection IC 4.

As shown in FIG. 5, in order to monitor the power supply voltage in the fuel gauge IC 3 and the protection IC 4 in the battery pack according to the related art, a wiring 8 is provided on the printed circuit board 2. The wiring 8 is used to connect the power-supply terminal 5 on the printed circuit board 2 to each of a power-supply-voltage monitoring terminal of the fuel gauge IC 3 and a power-supply-voltage monitoring terminal of the protection IC 4.

As shown in FIG. 5, the wiring 8 extending in the X direction is formed on the printed circuit board 2 to connect the power-supply terminal 5 to each of the power-supply-voltage monitoring terminal of the fuel gauge IC 3 and the power-supply-voltage monitoring terminal of the protection IC 4. In the battery pack according to the related art, the width of the printed circuit board 2 (in the Y direction) is enlarged. In the battery pack according to the related art, there has been a problem that it is difficult to promote the slimming of the lithium ion battery 1 (reduction of the dimensions in the Y direction).

Accordingly, in one aspect, the present disclosure provides a fuel gauge circuit and a battery pack which are capable of downsizing the substrate and promoting the slimming of the battery.

Means to Solve the Problem

In an embodiment which solves or reduces one or more of the above-mentioned problems, the present disclosure provides a fuel gauge circuit which detects a residual quantity of a battery and is disposed on a substrate together with a protection circuit which protects charging and discharging of the battery, the fuel gauge circuit including: a voltage monitor terminal disposed on a side of the fuel gauge circuit, facing a positive power-supply terminal of the substrate, and connected to each of the positive power-supply terminal of the substrate and a voltage sensor disposed in the fuel gauge circuit; a voltage through terminal disposed on a side of the fuel gauge circuit, facing the protection circuit and being opposite to the side facing the positive power-supply terminal, and connected to a voltage monitor terminal of the protection circuit; and a wiring disposed within the fuel gauge circuit to connect the voltage monitor terminal of the fuel gauge circuit to the voltage through terminal.

Effect of the Invention

According to the present disclosure, it is possible to provide a fuel gauge circuit and a battery pack which are capable of downsizing the substrate and promoting the slimming of the battery.

BEST MODE FOR CARRYING OUT THE INVENTION

A description will be given of embodiments of the present disclosure with reference to the accompanying drawings.
<Circuit Part of Battery Pack>

Figure 1:
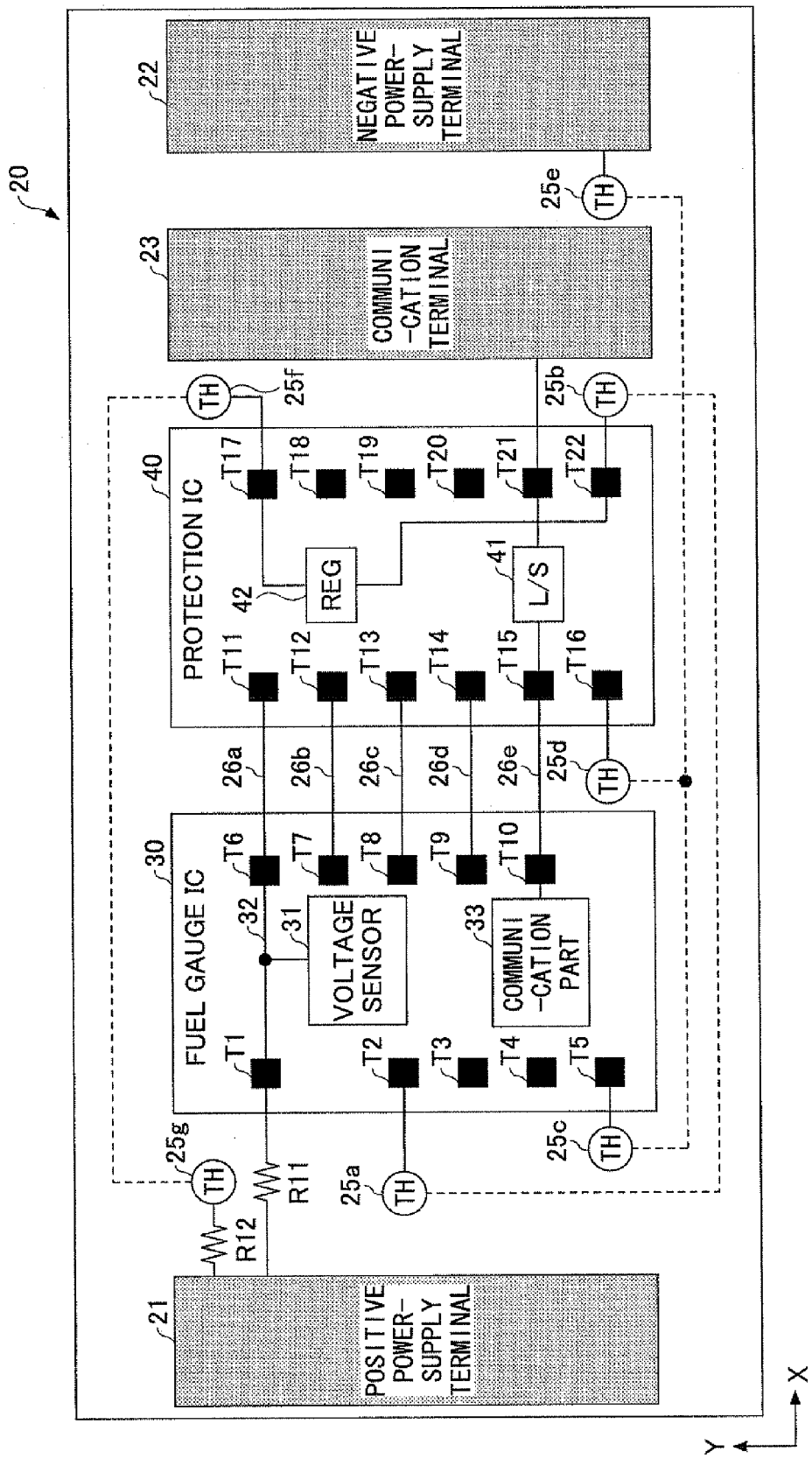
FIG. 1 is a top view of a circuit part of a battery pack of an embodiment of the present disclosure.
Figure 4:
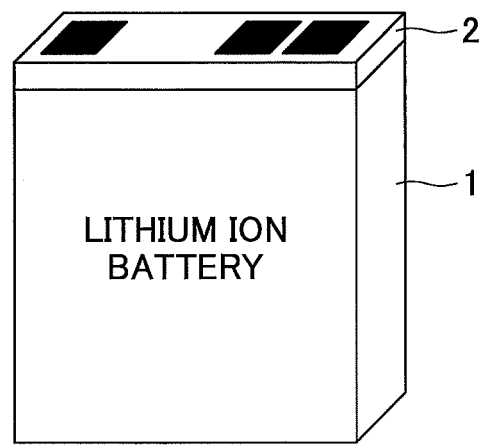
FIG. 4 is a perspective view showing the appearance of a battery pack.
Figure 5:
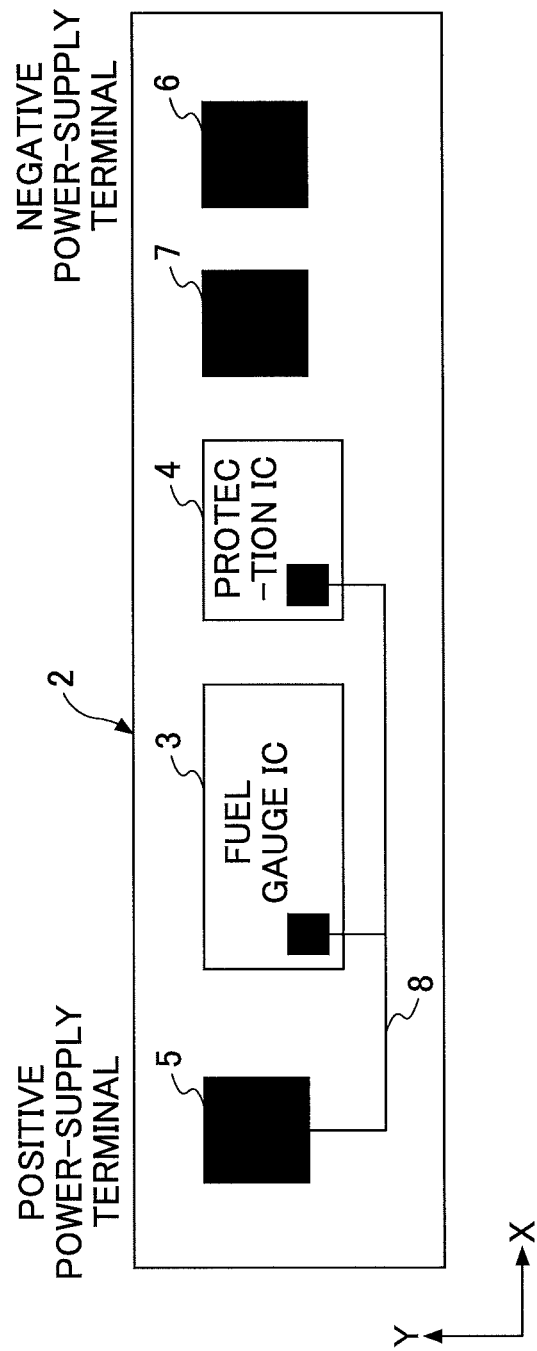
FIG. 5 is a top view of a circuit part of a battery pack according to the related art.

FIG. 1 is a top view of a circuit part of a battery pack of one embodiment of the present disclosure. A printed circuit board 20, shown in FIG. 1, is fixed to the top surface of the lithium ion battery 1 having the rectangular shape, shown in FIG. 4, and the printed circuit board 20 is used in such a condition.

As shown in FIG. 1, a fuel gauge IC 30 to detect a battery residual quantity, and a protection IC 40 having a regulator function are disposed at a central portion of the top surface of the printed circuit board 20, which constitute a circuit part in a COB (chip on board) configuration. A positive power-supply terminal 21, a negative power-supply terminal 22, and a communication terminal 23 are disposed at end portions of the top surface of the printed circuit board 20.

The power-supply terminals 21 and 22 are connected to the positive and negative electrodes of the lithium ion battery 1 via through holes (TH) of the printed circuit board 20, respectively. These power-supply terminals 21 and 22 are connected to the positive and negative power-supply terminals of a mobile device (not illustrated). The communication terminal 23 is connected to the communication terminal of the mobile device.

Terminals T1-T5 are disposed on a side of the fuel gauge IC 30 which faces the power-supply terminal 21, and terminals T6-T10 are disposed on the opposite side of the fuel gauge IC 30 which faces the protection IC 40. The terminal T1 is a voltage monitor terminal, and this terminal T1 is connected to the power-supply terminal 21 of the printed circuit board 20 via a resistor R11. By a wiring 32 (which is, for example, a metallic wiring) which is formed within the fuel gauge IC 30, the terminal T1 is connected to a voltage sensor 31 disposed in the fuel gauge IC 30, and the terminal T1 is connected to the terminal T6.

The terminal T2 is a positive power-supply terminal, and this terminal T2 is connected to a terminal T22 of the protection IC 40 via through holes 25a and 25b of the printed circuit board 20. Hence, an operating current is supplied to the fuel gauge IC 30 via the protection IC 40.

The terminals T3 and T4 are current monitor terminals, and these terminals T3 and T4 are connected to a current sensor disposed in the fuel gauge IC 30. The terminal T5 is a negative power-supply terminal, and this terminal T5 is connected to a negative power-supply terminal T16 of the protection IC 40 and the power-supply terminal 22 of the printed circuit board 20 via through holes 25c, 25d and 25e of the printed circuit board 20.

The terminal T6 is a voltage through terminal. The wiring 32 is connected to the terminal T6. The terminal T6 is connected to a terminal T11 of the protection IC 40 by a wiring 26a which is made of a bonding wire, for example.

The terminals T7, T8 and T9 are communication terminals. These terminals T7, T8 and T9 are respectively connected to terminals T12, T13 and T14 of the protection IC 40 by wirings 26b, 26c and 26d which are made of a bonding wire, for example.

By using the wirings 26b, 26c and 26d, the fuel gauge IC 30 and the protection IC 40 mutually transmit or receive control signals to or from the communication terminals. For example, the wiring 26b is a wiring for transmitting/receiving a discharge stop control signal, the wiring 26c is a wiring for transmitting/receiving a charge stop control signal, and the wiring 26d is a wiring for transmitting/receiving an enabling control signal.

The terminal T10 is a mobile-device communication terminal, and this terminal T10 is internally connected to the communication part 33 of the fuel gauge IC 30, and further connected to the opposing terminal T15 of the protection IC 40 by a wiring 26e which is made of a bonding wire, for example.

Terminals T11-T16 are disposed on a side of the protection IC 40 which faces the fuel gauge IC 30, and terminals T17-T22 are disposed on the opposite side of the protection IC 40 which faces the communication terminal 23. The terminal T11 is a voltage monitor terminal, and this terminal T11 is connected to the opposing terminal T6 of the fuel gauge IC 30 by the wiring 26a.

Each of the terminals T12, T13 and T14 is a communication terminal. These terminals are respectively connected to the opposing terminals T7, T8 and T9 of the fuel gauge IC 30 by the wirings 26b, 26c and 26d.

The terminal T15 is a mobile-device communication terminal, and this terminal T15 is connected to the opposing terminal T10 of the fuel gauge IC 30 by the wiring 26e, and further connected to a level shift circuit (L/S) 41 disposed in the protection IC 40.

The level shift circuit 41 performs the level shifting (voltage lowering) of a signal transmitted from the fuel gauge IC 30, and supplies the resulting signal to the terminal T21 which is a mobile-device communication terminal. The terminal T21 is connected to the communication terminal 23 of the printed circuit board 20. A protective element for preventing electrostatic discharge damage is provided on the terminal T21.

The terminal T16 is a negative power-supply terminal, and this terminal T16 is connected to the negative power-supply terminal 22 of the printed circuit board 20 via through holes 25d and 25e of the printed circuit board 20.

The terminal T17 is a positive power-supply terminal, and this terminal T17 is connected to the positive power-supply terminal 21 of the printed circuit board 20 via a resistor R12 (R11>>R12) and through holes 25f and 25g of the printed circuit board 20. The terminal T17 is further connected to a regulator (REG) 42 disposed in the protection IC 40.

The terminal T18 is a short-circuit detection terminal, and this terminal T18 is connected to a resistor (305) which is not shown in FIG. 1. The terminal T19 and the terminal T20 are a control terminal for controlling the discharging of the battery and a control terminal for controlling the charging of the battery respectively, and these terminals are connected to the gates of the discharge and charge control MOS transistors (M11, M12), which are not shown in FIG. 1.

The stable power supply voltage output by the regulator 42 is supplied from the terminal T22, which is a positive power-supply terminal, to the terminal T2 of the fuel gauge IC 30 via the through holes 25b and 25a of the printed circuit board 20.
<Fuel Gauge Circuit>

Figure 2:
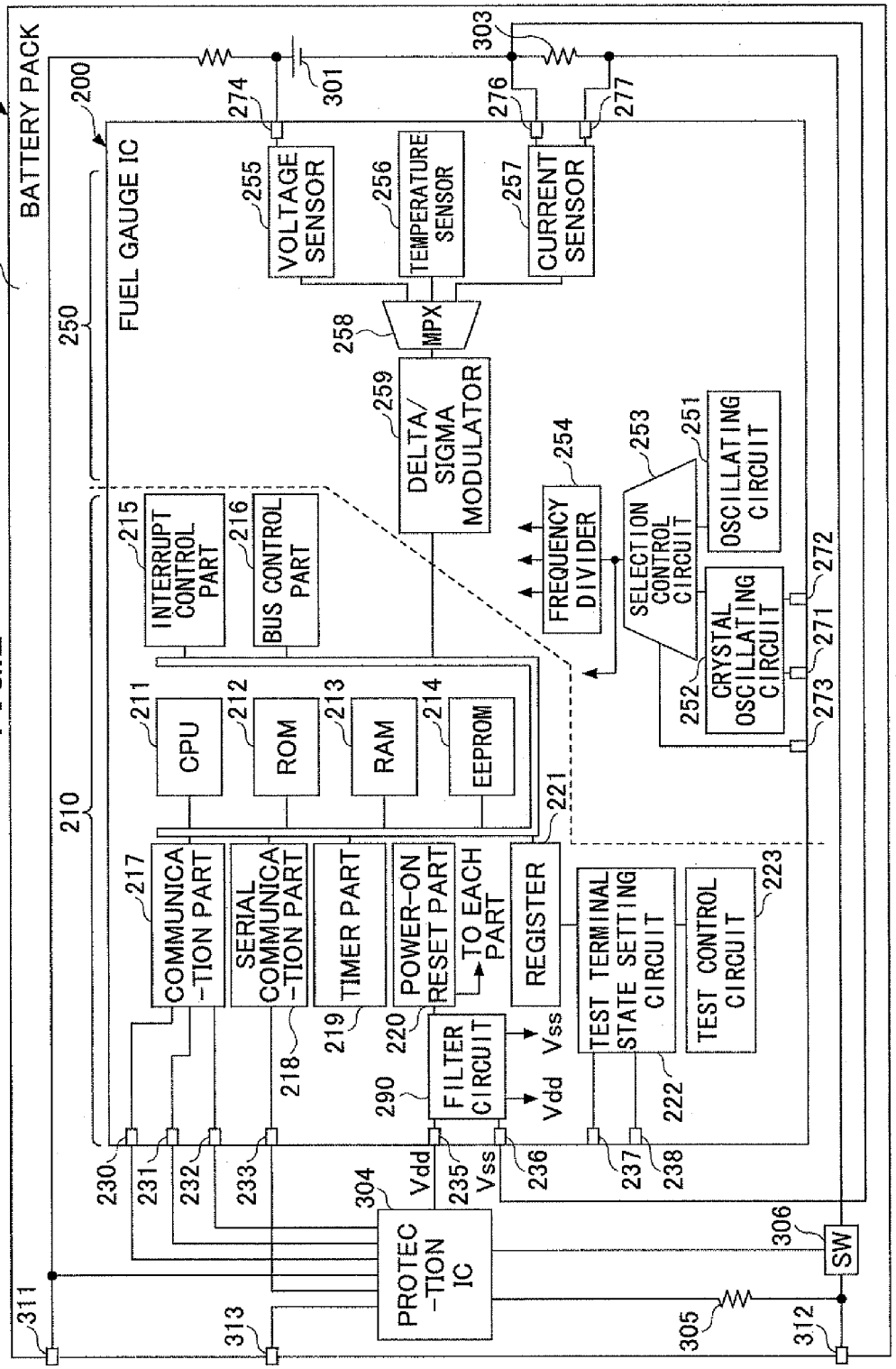
FIG. 2 is a block diagram showing the composition of a fuel gauge circuit of an embodiment of the present disclosure.

FIG. 2 is a block diagram showing the composition of a fuel gauge circuit of an embodiment of the present disclosure. FIG. 2 shows the circuit composition of the fuel gauge IC of this embodiment, but does not show the positional relationship between the respective components correctly. The fuel gauge IC 200 shown in FIG. 2 is equivalent to the fuel gauge IC 30 shown in FIG. 1. Generally speaking, the fuel gauge IC 200 is constructed to include a digital part 210 and an analog part 250.

In the digital part 210, a CPU 211, a ROM 212, a RAM 213, an EEPROM 214, an interrupt-control part 215, a bus control part 216, a communication part 217, a serial communication part 218, a timer part 219, a power-on reset part 220, a register 221, a test terminal state setting circuit 222, a test control circuit 223, and a filter circuit 290 are provided. In the digital part 210, the CPU 211, the ROM 212, the RAM 213, the EEPROM 214, the interrupt-control part 215, the bus control part 216, the communication part 217, the serial communication part 218, the timer part 219, and the register 221 are interconnected by the internal bus.

The CPU 211 executes the program read from the ROM 212 to control the entire fuel gauge IC 200, and performs the process which computes the sum of charging/discharging currents of the battery to compute the battery residual quantity. At this time, the RAM 213 is used by the CPU 211 as a workspace. Trimming information, etc. is stored in the EEPROM 214.

The interrupt-control part 215 receives an interrupt request signal from each part of the fuel gauge IC 200, generates an interruption event according to the priority of each interrupt request, and notifies the CPU 211 of the interruption event. The bus control part 216 performs a congestion control that determines which of the circuit components preferentially uses the internal bus, in order to prevent congestion between the circuit components from occurring.

The communication part 217 performs communication between the fuel gauge IC 200 and the protection IC 304 via ports 230, 231 and 232. The serial communication part 218 is connected to the protection IC 304 via a port 233, and performs communication between the mobile devices through the protection IC 304.

In FIG. 2, the protection IC 304 is equivalent to the protection IC 40 of FIG. 1, the ports 230, 231 and 232 are equivalent to the terminals T7, T8 and T9 of FIG. 1 respectively, and the serial communication part 218 and the port 233 are equivalent to the communication part 33 and the terminal T10 of FIG. 1 respectively.

The timer part 219 performs counting of system clocks, and the count value of the timer part 219 is accessed by the CPU 211. The power-on reset part 220 detects that a rising edge of the power supply voltage Vdd supplied to the port 235 (which is connected to the power-on reset part 220 via the filter circuit 290) has occurred, generates a reset signal, and supplies the reset signal to each part of the fuel gauge IC 200.

The information from the EEPROM 214 is transferred to the register 221. The test terminal state setting circuit 222 short-circuits between the test terminals 237, 238 and the test control circuit 223 based on the information held in the register 221, and sets the voltage input to the test control circuit 223 connected to the test terminals 237 and 238 to a predetermined level.

When the input signal of the test terminals 237 and 238 is received at the test control circuit 223, the test control circuit 223 changes the state of the internal circuit based on the received input signal, and enables the test of the internal circuit of the fuel gauge IC 200 to be performed.

In the analog part 250, an oscillating circuit 251, a crystal oscillating circuit 252, a selection control circuit 253, a frequency divider 254, a voltage sensor 255, a temperature sensor 256, a current sensor 257, a multiplexer 258, and a delta/sigma modulator 259 are provided.

The oscillating circuit 251 is an oscillator including a PLL, and outputs an oscillation signal with a frequency of several MHz. The crystal oscillating circuit 252 oscillates when a crystal resonator is externally attached to the ports 271 and 272, and outputs an oscillation signal with a frequency of several MHz. The oscillating frequency of the crystal oscillating circuit 252 is higher in accuracy than the oscillating frequency of the oscillating circuit 251.

The selection control circuit 253 selects one of the oscillation signals output from the oscillating circuit 251 and the crystal oscillating circuit 252, based on the selection signal received from the port 273, and supplies the selected oscillation signal to each part of the fuel gauge IC 200 as a system clock, and to the frequency divider 254.

The selection control circuit 253 generates a reset signal RST and a control signal CNT. When the selection control circuit 253 does not receive a selection signal from the port 273, for example, the oscillation signal output from the oscillating circuit 251 is selected. The frequency divider 254 performs frequency dividing of the system clock, generates some clock signals, and supplies the clock signals to the relevant parts of the fuel gauge IC 200.

The voltage sensor 255 detects a power supply voltage of the battery 301 which is externally attached to the port 274, and supplies an analog signal indicating the detected voltage to the multiplexer 258. The temperature sensor 256 detects a temperature of the environment of the fuel gauge IC 200, and supplies an analog signal indicating the detected temperature to the multiplexer 258.

The ports 276 and 277 are connected to the ends of the resistor 303 for current detection which are connected to the ports 276 and 277. The current sensor 257 detects a current flowing through the resistor 303 based on the potential difference between the ports 276 and 277, and supplies an analog signal indicating the detected current to the multiplexer 258.

In FIG. 2, the voltage sensor 255 and the port 274 are equivalent to the voltage sensor 31 and the terminal T1 of FIG. 1 respectively, and the ports 276 and 277 are equivalent to the terminals T3 and T4 of FIG. 1 respectively.

The multiplexer 258 sequentially selects one of the detected voltage of the analog signal, the detected temperature of the analog signal, and the detected current of the analog signal, and supplies the selected signal to the delta sigma modulator 259. The delta sigma modulator 259 performs delta/sigma conversion of each detection value, and supplies the pulse-density modulation data to the CPU 211 via the internal bus. The CPU 211 performs the digital filter process and generates the digital value of each of the detected voltage, the detected temperature and the detected current. The CPU 211 computes the battery residual quantity by computing the sum of the charging/discharging currents of the battery. In this case, the detected temperature is used for temperature correction of the battery residual quantity.

The fuel gauge IC 200 described above is accommodated in the housing 310 together with the battery 301, the resistor 303 for current detection, the protection IC 304, the resistor 305 and the switch 306, which constitute the battery pack 300. The protection IC 304 of FIG. 2 is equivalent to the protection IC 40 of FIG. 1.

The positive electrode of the battery 301 and the power input terminal of the protection IC 304 are connected to the terminal 311 of the battery pack 300, and the power-supply output terminal of the protection IC 304 is connected to the port 235 of the power supply voltage Vdd of the fuel gauge IC 200.

The terminal 312 is connected to the ground terminal of the protection IC 304 via the resistor 305, and further connected through the switch 306 to the junction point to the port 277 of the resistor 303 for current detection. The protection IC 304 stabilizes the voltage between the terminals 311 and 312. If this voltage goes out of a predetermined range, the protection IC 304 protects the battery by turning off the switch 306.

The junction point between the port 276 and the resistor 303 for current detection is connected to port 236 of the power supply voltage Vss of the fuel gauge IC 200. The terminal of the protection IC 304 is connected to the terminal 313 of the battery pack 300. The terminals 311, 312 and 313 of FIG. 2 are equivalent to the power-supply terminals 21, 22 and the communication terminal 23 of FIG. 1, respectively.

<Protection Circuit>

Figure 3:
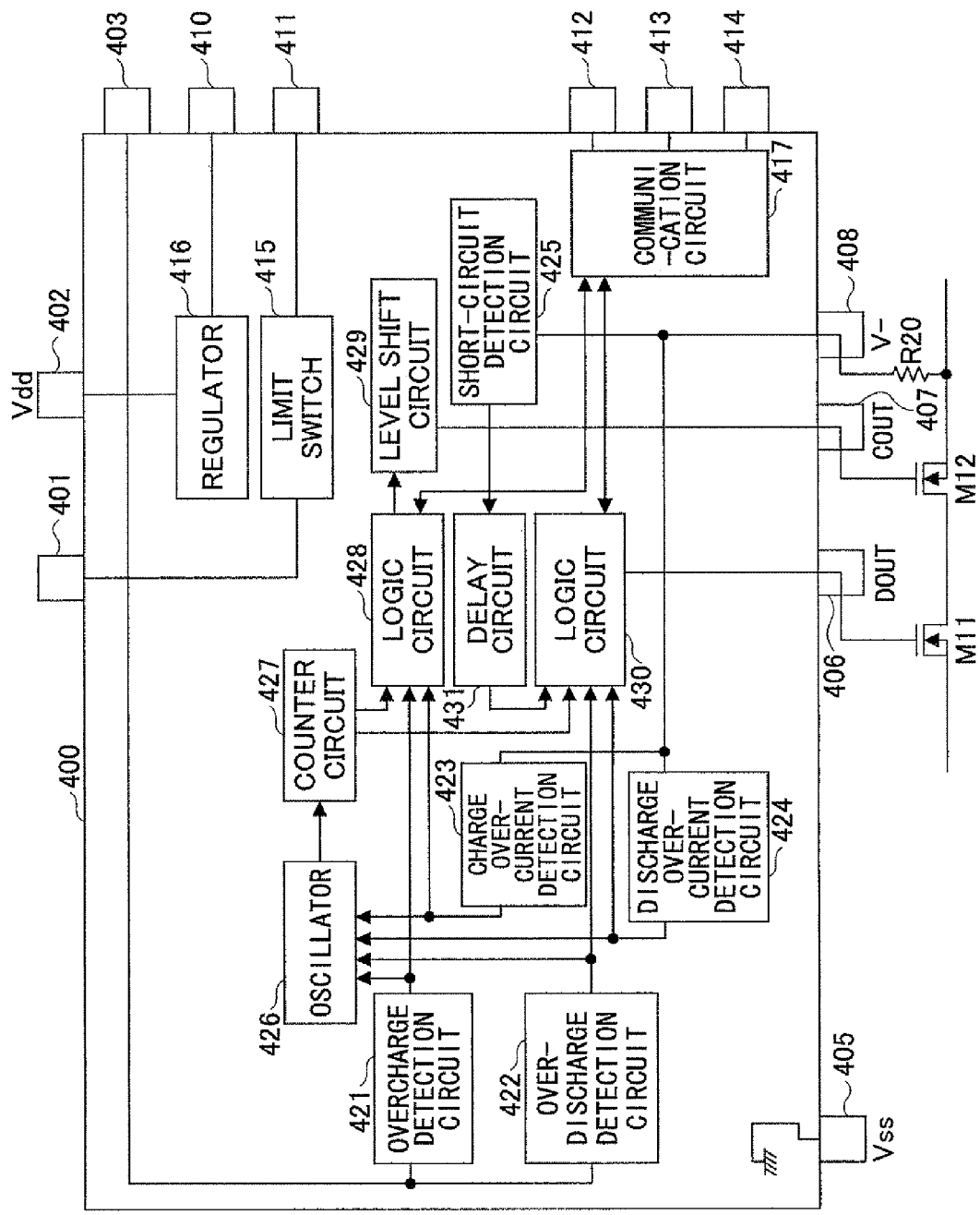
FIG. 3 is a block diagram showing the composition of a protection circuit of an embodiment of the present disclosure.

FIG. 3 is a block diagram showing the composition of a protection circuit of an embodiment of the present disclosure. The protection IC 400 shown in FIG. 3 is equivalent to the protection IC 40 shown in FIG. 1.

As shown in FIG. 3, ports 401-403, ports 405-408, and ports 410-414 are disposed in the protection IC 400.

The port 401 of FIG. 3 is equivalent to the mobile-device communication terminal T15 of FIG. 1, and this port 401 is connected to one of the input/output terminals of the level shift circuit 415. The level shift circuit 415 of FIG. 3 is equivalent to the level shift circuit 41 of FIG. 1. The other of the input/output terminals of the level shift circuit 415 is connected to the port 411 which is equivalent to the mobile-device communication terminal T21 shown in FIG. 1. A protective element for preventing electrostatic discharge damages is provided on the port 411.

The port 402 of FIG. 3 is equivalent to the positive power-supply terminal T17 of FIG. 1, and this port 402 is connected to the regulator 416. The regulator 416 stabilizes the power supply voltage supplied from the port 402, and supplies the resulting voltage to each part of the protection IC 400. In order to supply the stable power supply voltage to the fuel gauge IC 30, the output terminal of the regulator 416 is connected to the port 410 which is equivalent to the positive power-supply terminal T22 of FIG. 1.

The port 403 of FIG. 3 is equivalent to the voltage monitor terminal T11 of FIG. 1, and this port 403 is connected to each of the overcharge detection circuit 421 and the overdischarge detection circuit 422 which are disposed in the protection IC 400.

The port 405 of FIG. 3 is equivalent to the negative power-supply terminal T16 of FIG. 1. The ports 406 and 407 of FIG. 3 are equivalent to the control terminal T19 for the discharge control and the control terminal T20 for the charge control of FIG. 1 respectively. These ports 406 and 407 are respectively connected to the gates of the MOS transistors M11 and M12 which are externally attached.

The port 408 of FIG. 3 is equivalent to the short-circuit detection terminal T18 of FIG. 1, and this port 4-8 is connected to the resistor R20 which is externally attached. The MOS transistors M11 and M12 of FIG. 3 are equivalent to the switch 306 of FIG. 2, and the resistor R20 of FIG. 3 is equivalent to the resistor 305 of FIG. 2.

The ports 412, 413 and 414 of FIG. 3 are equivalent to the communication terminals T12, T13 and T14 of FIG. 1 respectively, and these ports are connected to the communication circuit 417 disposed in the protection IC 400. The communication circuit 417 performs communication with the communication part 217 of FIG. 2.

The protection IC 400 is constructed to include an overcharge detection circuit 421, an overdischarge detection circuit 422, a charge overcurrent detection circuit 423, a discharge overcurrent detection circuit 424, and a short circuit detection circuit 425. The overcharge detection circuit 421 detects an overcharge of the lithium ion battery 1 based on the voltage of the port 403, and supplies a detection signal to each of the oscillator 426 and the logic circuit 428. The overdischarge detection circuit 422 detects an overdischarge of the lithium ion battery 1 based on the voltage of the port 403, and supplies a detection signal to each of the oscillator 426 and the logic circuit 430.

The charge overcurrent detection circuit 423 detects an overcurrent which is caused by an excessive amount of current flowing into the MOS transistor Mil and the MOS transistor M12, based on the voltage of the port 408, and supplies a detection signal to each of the oscillator 426 and the logic circuit 428. The discharge overcurrent detection circuit 424 detects an overcurrent which is caused by an excessive amount of current flowing into the MOS transistor M11 and the MOS transistor M12, based on the voltage of the port 408, and supplies a detection signal to each of the oscillator 426 and the logic circuit 430. The short circuit detection circuit 425 detects a short circuit between the ports 402 and 408 based on the voltage of the port 408, and supplies a detection signal to the logic circuit 430 through the delay circuit 431.

A clock signal from the oscillator 426 is supplied to the counter circuit 427, and the counter circuit 427 performs counting of the clock signal pulses. The counter circuit 427 supplies a control signal to the logic circuits 428 and 430 based on the result of the counting. For example, if the overcharge detection circuit 421 or the charge overcurrent detection circuit 423 outputs a detection signal at the time of charging (the MOS transistors M11 and M12 are turned on), the oscillation of the oscillator 426 is started to output the clock signal. When the value indicated by the result of the counting of the clock signal pulses reaches a predetermined value, the counter circuit 427 supplies a high-level control signal to the logic circuit 428.

After the detection signal is output and the high-level control signal is received from the counter circuit 427, the logic circuit 428 sets the control signal being supplied to the gate of the MOS transistor M12 to a low level, in order to stop the charging, and the level shift circuit 429 performs the level shifting of the control signal to reduce the signal level by a predetermined value, and supplies the resulting signal to the gate of MOS transistor M12 from the port 407. Thereby, the charging of the lithium ion battery 1 is stopped. The level shifting is performed because the electric potential at one end of the resistor R20, the other end of which is connected to the port 408, is lower than that of the port 405.

If the overdischarge detection circuit 422 or the discharge overcurrent detection circuit 424 outputs a detection signal at the time of discharging (the MOS transistors M11 and M12 are turned on), the oscillation of the oscillator 426 is started to output the clock signal. When the value indicated by the result of the counting of the clock signal pulses reaches a predetermined value, the counter circuit 427 supplies a high-level control signal to the logic circuit 430.

After the detection signal is output and the high-level control signal is received from the counter circuit 427, the logic circuit 430 sets the control signal being supplied to the gate of the MOS transistor M11 to a low level, in order to stop the discharging, and supplies this control signal to the gate of the MOS transistor M11 from the port 406.

The detection signal of the short circuit detection circuit 425 is delayed by the delay circuit 431, similar to the delay by the counter circuit 427, and supplied to the logic circuit 430. The logic circuit 430 sets the control signal being supplied to the gate of the MOS transistor M11 to a low level, in order to stop the discharging, and supplies this control signal to the gate of MOS transistor M11 from the port 406. Thereby, the discharging of the lithium ion battery 1 is stopped.

The logic circuits 428 and 430 are connected to the communication circuit 417, and the charge stop or discharge stop control signal output from the logic circuits 428 and 430 is supplied from the communication circuit 417 to the communication part 217 of the fuel gauge IC 200. Conversely, the charge stop or discharge stop control signal may be supplied from the communication part 217 of the fuel gauge IC 200 to the logic circuits 428 and 430 through the communication circuit 417.

According to the above-described embodiment, the voltage monitor terminal T1 and the voltage through terminals T6 are internally connected by the wiring 32 in the fuel gauge IC 30, and it is not necessary to provide a wiring which extends in the X direction on the printed circuit board 20. The width dimension (the dimension in the Y direction) of the printed circuit board 20 can be reduced, and the slimming of the lithium ion battery 1 can be promoted.

According to the above-described embodiment, the communication terminals T7, T8 and T9 of the fuel gauge IC 30 and the communication terminals T12, T13 and T14 of the protection IC 40 are disposed on the sides where the fuel gauge IC 30 and the protection IC 40 are mutually opposed, respectively, and the communication terminals T7, T8 and T9 and the communication terminals T12, T13 and T14 face each other. It is possible to minimize the wire length of the wirings 26b, 26c and 26d to connect the communication terminals T7, T8 and T9 and the communication terminals T12, T13 and T14 respectively.

Similarly, the mobile-device communication terminal T10 of the fuel gauge IC 30 and the mobile-device communication terminal T15 of the protection IC 40 are disposed on the sides where the fuel gauge IC 30 and the protection IC 40 are mutually opposed, respectively, and the mobile-device communication terminal T10 and the mobile-device communication terminal T15 face each other. It is possible to minimize the wire length of the wiring 26e to connect the mobile-device communication terminal T10 and the mobile-device communication terminal T15.

According to the above-described embodiment, the level shift circuit 41 is provided in the protection IC 40, bidirectional communication can be performed between the fuel gauge IC 30 and the mobile device which use signals with different levels. Furthermore, the protective element for preventing electrostatic discharge damage is provided on the mobile-device communication terminal T21 of the protection IC 40, and the electrostatic discharge damaging of the fuel gauge IC 30 can be prevented.

The present disclosure is not limited to the above-described embodiments, and variations and modifications may be made without departing from the scope of the present disclosure.

The present international application is based on and claims the benefit of priority of Japanese patent application No. 2009-006161, filed on Jan. 14, 2009, the contents of which are incorporated herein by reference in their entirety.

DESCRIPTION OF THE REFERENCE NUMERALS 20 printed circuit board
21, 22 power-supply terminal
23 communication terminal
25a-25g through hole
26a-26e wiring
30 fuel gauge IC
31 voltage sensor
32 wiring
33 communication part
40 protection IC
41 level shift circuit
T1-T22 terminal

The invention claimed is:

1. A fuel gauge system for detecting a residual quantity of a battery, comprising:
   a substrate having a positive power-supply terminal;
   a protection circuit disposed on the substrate, the protection circuit protecting charging and discharging of the battery, and having a voltage monitor terminal; and
   a fuel gauge circuit disposed on the substrate, comprising:
      a voltage sensor;
      a voltage monitor terminal disposed on a side of the fuel gauge circuit, facing the positive power-supply terminal of the substrate, and connected to each of the positive power-supply terminal of the substrate and the voltage sensor disposed in the fuel gauge circuit;
      a voltage through terminal disposed on a side of the fuel gauge circuit, facing the protection circuit and being opposite to the side facing the positive power-supply terminal, and connected to the voltage monitor terminal of the protection circuit; and
      a wiring disposed within the fuel gauge circuit to connect the voltage monitor terminal of the fuel gauge circuit to the voltage through terminal.

2. The fuel gauge system according to claim 1, further comprising a communication terminal disposed on the side of the fuel gauge circuit, facing the protection circuit, and connected to a communication terminal of the protection circuit to perform bidirectional communication.

3. The fuel gauge system according to claim 2, further comprising a mobile-device communication terminal disposed on the side of the fuel gauge circuit, facing the protection circuit, and connected to a mobile-device communication terminal of the protection circuit to perform bidirectional communication through the protection circuit between a communication part disposed in the fuel gauge circuit and a communication part of a mobile device in which the battery is installed.

4. A battery pack comprising the battery and the substrate, the substrate disposed on a surface of the battery and comprising:
   the fuel gauge system of claim 3;
   wherein the protection circuit comprises a level shift circuit to perform level shifting of a signal transmitted between the communication part of the fuel gauge circuit and the communication part of the mobile device.

* * * * *